United States Patent
Tani et al.

(10) Patent No.: US 7,002,080 B2
(45) Date of Patent: Feb. 21, 2006

(54) MULTILAYER WIRING BOARD

(75) Inventors: Motoaki Tani, Kawasaki (JP);
Nobuyuki Hayashi, Kawasaki (JP);
Tomoyuki Abe, Kawasaki (JP);
Yasuhito Takahashi, Kawasaki (JP);
Takashi Shuto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 216 days.

(21) Appl. No.: 10/629,770

(22) Filed: Jul. 30, 2003

(65) Prior Publication Data
US 2004/0040738 A1    Mar. 4, 2004

(30) Foreign Application Priority Data
Aug. 27, 2002    (JP)    ............................ 2002-247846

(51) Int. Cl.
*H05K 1/00*    (2006.01)
(52) U.S. Cl. .................... 174/258; 174/255; 428/209
(58) Field of Classification Search ................. 174/255, 174/262, 263, 264, 265, 266, 260, 250, 261; 361/792, 793, 794, 795, 760; 428/209, 901
See application file for complete search history.

(56) References Cited

U.S. PATENT DOCUMENTS

| 4,591,659 | A |   | 5/1986 | Leibowitz |
| 4,689,110 | A |   | 8/1987 | Leibowitz |
| 4,812,792 | A |   | 3/1989 | Leibowitz |
| 5,350,621 | A | * | 9/1994 | Yuhas et al. ................. 428/209 |
| 5,825,629 | A | * | 10/1998 | Hoebener et al. ........... 361/777 |
| 6,013,588 | A |   | 1/2000 | Ozaki |
| 6,222,740 | B1 | * | 4/2001 | Bovensiepen et al. ....... 361/795 |
| 6,274,821 | B1 | * | 8/2001 | Echigo et al. .............. 174/255 |
| 6,613,413 | B1 | * | 9/2003 | Japp et al. ................... 428/131 |
| 6,869,665 | B1 | * | 3/2005 | Tani et al. ................... 428/209 |
| 2002/0139578 | A1 | * | 10/2002 | Alcoe et al. ................ 174/262 |
| 2002/0157859 | A1 | * | 10/2002 | Vasoya et al. .............. 174/250 |

FOREIGN PATENT DOCUMENTS

JP    2000-138453    5/2000

* cited by examiner

*Primary Examiner*—Kamand Cuneo
*Assistant Examiner*—Ishwar (I. B.) Patel
(74) *Attorney, Agent, or Firm*—Staas & Halsey LLP

(57) ABSTRACT

A multilayer wiring board is composed of a core portion, a first wiring portion and a second wiring portion. The core portion includes a core insulating layer containing a carbon fiber material. The first wiring portion is bonded to the core portion and has a laminated structure including at least a first insulating layer and a first wiring pattern, the first insulating layer containing glass cloth. The second wiring portion is bonded to the first wiring portion and has a laminated structure including at least a second insulating layer and a second wiring pattern. The core portion, the first wiring portion and the second wiring portion are arranged in a stack.

9 Claims, 9 Drawing Sheets

MULTILAYER WIRING BOARD

BACKGROUND OF THE INVENTION

1. Field of the Invention

The present invention relates to a multilayer wiring board suitable for providing semiconductor chip mounting boards, motherboards, substrates for probe cards, and so on.

2. Description of the Related Art

In recent years, there is an increasing requirement for higher performance and smaller size in electronic products. Accordingly, there is an ever-accelerating trend toward high density mounting of electronic parts incorporated in these electronic products. In an effort to meet such a high density mounting, semiconductor chips are often surface-mounted as bare chips onto the wiring board (flip-chip mounting). Changes have also been observed with respect to the wiring board for mounting these semiconductor chips. Specifically, as a semiconductor chip has a larger number of connector pins, a multilayer wiring board is preferably used due to the advantage in high density wiring. Semiconductor packages, which may contain these semiconductor chips and wiring boards, are necessary parts in electronic circuits, and so are mounted further on a motherboard. The motherboard can also be a multilayer wiring board in order to achieve desirable high density wiring. In response to the high pin-count trend in devices and chips multilayer substrates are also used in probe cards for inspection purposes.

In the flip-chip mounting, an under filler is generally used to fill a gap between the wiring board and the semiconductor chips mounted thereon. If the under filler is not used, electrical connection between the wiring board and the semiconductor chips is often not desirably reliable because of difference in thermal expansion coefficient between the wiring board and the semiconductor chips. Typically, a semiconductor chip made of common row materials has a thermal expansion coefficient of about 3.5 ppm/K along the plane of surface. On the other hand, a typical wiring board including a core substrate provided by a glass epoxy substrate has a thermal expansion coefficient of about 12 through 20 ppm/K along the plane of surface. Thus, the difference in the thermal expansion coefficient between the two is relatively large. For this reason, change or repeated changes in ambient temperature can easily create stress in electrical connections between the wiring board and the semiconductor chips. When the stress at the electrical connection exceeds a certain limit, the electrical connection, or a boundary surface between bumps on the semiconductor chip and electrode pads on the wiring board, can easily crack or separate from each other. The under filler applied between the semiconductor chip and the wiring board during the flip-chip mounting buffers the stress which develops at the electric connection. Due to this stress reduction capability, incidence of cracking and separation is decreased and connection reliability in the flip-chip mounting is increased.

However, when a large semiconductor chip is mounted on a wiring board, the stress reduction by the under filler alone is often not sufficient for ensuring desirable reliability. This is because the absolute amount of thermal expansion difference between the semiconductor chip and the wiring board resulting from the difference in the thermal expansion coefficient of the two components increases with an increasing size of the chip. A larger thermal expansion difference creates a greater stress at the electrical connection. Such a problem can also develop when a semiconductor wafer or a relatively large semiconductor chip is mounted on a probe card for performance inspection.

The above problem resulting from the difference in the thermal expansion coefficient between the wiring board and the semiconductor chip could be eliminated or reduced by using a wiring board having a small thermal expansion coefficient. Wiring substrates having a small thermal expansion coefficient are conventional. There is known a wiring board using a core substrate provided by a metal which has a small thermal expansion coefficient. The metal core substrate is generally made of aluminum, copper, silicon steel, nickel-iron alloy, CIC (a clad material having a structure of copper/Inver/copper) and so on. A wiring board including a copper core substrate is disclosed in the Japanese Patent Laid-Open 2000-138453 for example. However, all of these metals are considerably heavy, having large specific gravity values, and make the resulting wiring board disadvantageously heavy. In addition, metal core substrates have poor machinability in micro machining processes, and often difficult to form minute holes, to make into a thin laminate, and so on.

There is another known method for reducing thermal expansion in the wiring board. The method uses carbon material. Such a technique is disclosed in the Japanese Patent Laid-Open 60-140898, the Japanese Patent Laid-Open 11-40902, and the Japanese Patent Publication 2001-332828 for example.

The Japanese Patent Laid-Open 60-140898 discloses a wiring board of a multilayer structure in which an insulating graphite layer including a carbon fiber sheet and a wiring layer of copper are alternated in lamination. The thermal expansion coefficient of this wiring board is small due to the graphite layers. A problem, however, is that the multilayer structure in such a wiring board is formed by so-called single step pressing method, and it is known that formation of a multi-layered micro-wiring structure and therefore formation of fine-pitched electrodes for external connection is difficult to achieve by this method. For this reason, the wiring board disclosed in the Japanese Patent Laid-Open 60-140898 is not suitable for mounting or installing semiconductor chips having external connection electrodes formed at a fine pitch.

The Japanese Patent Laid-Open 11-40902 discloses a wiring board of a multilayer structure in which a core substrate including a carbon fiber sheet has two surfaces each laminated with an insulating layer of a prepreg which contains glass fiber, and a layer of copper wiring. The thermal expansion coefficient of this wiring board is small since the core substrate includes a carbon fiber sheet. However, according to the Japanese Patent Laid-Open 11-40902, the multilayer structure in such a multilayer wiring board is formed by a single step pressing method. For this reason, the wiring board disclosed in the Japanese Patent Laid-Open 11-40902 is not suitable for mounting or installing semiconductor chips having external connection electrodes formed at a fine pitch.

The Japanese Patent Publication 2001-332828 discloses a wiring board of a multilayer structure in which a core substrate including a carbon-containing fibers has two surfaces each laminated with an insulating layer of a prepreg which does not contain glass fiber, and a layer of copper wiring. However, there is a considerably large difference in thermal expansion coefficient between the core substrate which includes the carbon-containing fibers and the prepreg which does not include glass fibers. When there is a large difference in thermal expansion coefficient, the core substrate and the insulating layer can separate easily, and if the separation occurs between the core substrate and the insulating layer, the wiring can be subjected to an undesirably large stress and eventually cut. Therefore, according to the technique disclosed in the Japanese Patent Laid-Open 2001-332828, it is sometimes difficult to appropriately obtain a wiring board which has a small, overall thermal expansion coefficient.

SUMMARY OF THE INVENTION

The present invention was made under the circumstances described above, and therefore aims at providing a multilayer wiring board which can be formed with micro-wiring structures and has an appropriately small thermal expansion coefficient.

A multilayer wiring board provided by a first aspect of the present invention has a laminated structure. Specifically, the wiring board may comprise: a core portion including a core insulating layer containing a carbon fiber material; a first lamination wiring portion bonded to the core portion and having a laminated structure including at least a first insulating layer and a first wiring pattern; and a second lamination wiring portion bonded to the first lamination wiring portion and having a laminated structure including at least a second insulating layer and a second wiring pattern. The core portion, the first lamination wiring portion and the second lamination wiring portion are arranged in a stack.

A multilayer wiring board having such a structure as the above can include micro-wiring patterns. The second lamination wiring portion in the multilayer wiring board according to the first aspect of the present invention has a laminated structure including the second insulating layer and the second wiring pattern. The second insulating layer does not include fiber material such as carbon fiber material and glass cloth. Thus, the second lamination wiring portion can be formed by so-called build-up method. It is known that the build-up method is capable of making a laminated wiring structure such as a multilayer wiring structure which includes micro-wiring patterns formed at a high density. Therefore, as far as the second lamination wiring portion according to the present invention is concerned, it is possible to form micro-wiring patterns at a high density by build-up method.

Since the second lamination wiring portion can have micro-wiring patterns, it becomes possible to provide the outermost second wiring pattern with fine-pitched electrodes for external connection. As a result, it becomes possible to mount or install semiconductor chips having finely pitched electrodes for external connection. As understood, the multilayer wiring board according to the first aspect of the present invention can include micro-wiring patterns, and therefore can appropriately meet the high pin-count trend or high density mounting of semiconductor chips.

The multilayer wiring board according to the first aspect of the present invention has an appropriately low thermal expansion coefficient. Specifically, good bonding is achieved among the core portion, the first lamination wiring portion, and the second lamination wiring portion whereas a net thermal expansion coefficient of the overall multilayer wiring board is small.

According to the first aspect of the present invention, the core insulating layer of the core portion includes a carbon fiber material. The carbon fiber material is provided by e.g. a carbon fiber mesh made of carbon fiber threads which are bundles of carbon fibers, a carbon fiber cloth woven of the carbon fiber threads, and a carbon fiber nonwoven fabric made of the carbon fiber threads. According to the first aspect of the present invention, such a carbon fiber material extends inside the core insulating layer, in directions along a plane of surface of the core insulating layer. Thus, thermal expansion coefficient is small in the core insulating layer and therefore in directions along the plane of surface of the core portion. The thermal expansion coefficient can be close to that of the semiconductor chip. Net thermal expansion coefficient of the overall multilayer wiring board depends heavily on thermal expansion coefficient of the core portion.

On the other hand, the insulating layer of the first lamination wiring portion, i.e. the first insulating layer, includes glass cloth. Glass cloth has a thermal expansion coefficient larger than that of carbon fiber materials and smaller than that of resin materials. According to the first aspect of the present invention, the glass cloth extends inside the first insulating layer, in directions along a plane of surface of the first insulating layer. Further, the insulating layer of the second lamination wiring portion, i.e. the second insulating layer, does not include a base material such as glass cloth and carbon fiber material. The first insulating layer, which includes glass cloth, occupies a significant portion of the volume of the first lamination wiring portion. Therefore, the thermal expansion coefficient along the plane of surface of the first lamination wiring portion is larger than the thermal expansion coefficient along the plane of surface of the core portion which includes a carbon fiber material, and smaller than the thermal expansion coefficient along the plane of surface of the second lamination wiring portion in which the second insulating layer including no base material occupies a significant portion of the volume. In other words, as far as the thermal expansion coefficient along the plane of surface is concerned, the first lamination wiring portion comes between the core portion and the second lamination wiring portion. According to such an arrangement, difference in the thermal expansion coefficient between the core portion and the first lamination wiring portion is relatively small, and difference in the thermal expansion coefficient between the first lamination wiring portion and the second lamination wiring portion is relatively small. As a result, delamination between the core portion and the first lamination wiring portion is eliminated or reduced, and delamination between the first lamination wiring portion and the second lamination wiring portion is eliminated or reduced.

As described, the multilayer wiring board according to the first aspect of the present invention includes: a core portion which has a thermal expansion coefficient small enough to make the overall thermal expansion coefficient of the substrate; a second lamination wiring portion which can be formed by a build-up method to include micro-wiring patterns and has a thermal expansion coefficient fairly larger than the thermal expansion coefficient of the core portion; and a first lamination wiring portion which has a thermal expansion coefficient between those of the core portion and the second lamination wiring portion. For this reason, good bonding is maintained between the core portion and the first lamination wiring portion as well as between the first lamination wiring portion and the second lamination wiring portion, yet the net thermal expansion coefficient of the overall multilayer wiring board is small.

As described, according to the first aspect of the present invention, a multilayer wiring board can include micro-wiring patterns and have an appropriately small thermal expansion coefficient. Such a multilayer wiring board is suitable for mounting semiconductor chips having finely pitched external connection electrodes and an essentially small-thermal expansion coefficient.

A second aspect of the present invention provides another multilayer wiring board. This multilayer wiring board has a laminated structure comprising: a core portion including a core insulating layer containing a carbon fiber material; two first lamination wiring portions respectively bonded to two sides of the core portion which are facing away from each other, each first lamination wiring portion having a laminated structure including at least a first insulating layer and a first wiring pattern; and a second lamination wiring portion bonded to one of the first lamination wiring portions and having a laminated structure including at least a second insulating layer and a second wiring pattern.

Such an arrangement as the above includes the arrangement according to the first aspect of the present invention. Therefore, the second aspect of the present invention also offers the advantages as described with respect to the first aspect. In addition, in the arrangement according to the second aspect, the first lamination wiring portion which is relatively rigid is placed on each side of the core portion, making a symmetric structure. This arrangement is advantageous in reducing warpage of the so-called base substrate which includes the core portion and the pair of first lamination wiring portions, and therefore advantageous in reducing warpage of the overall multilayer wiring board.

According to the second aspect of the present invention, preferably, the multilayer wiring board further includes another of the second lamination wiring portion bonded to the other of the two first lamination wiring portions and having a laminated structure including at least a second insulating layer and a second wiring pattern. Such an arrangement, in which not only the first lamination wiring portions but also the second lamination wiring portions are placed in symmetry on both sides of the core portion, is advantageous in reducing warpage of the overall multilayer wiring board.

According to the first and the second aspects of the present invention, preferably, a laminated structure including the core portion and all of the first lamination wiring portions has a through-hole via penetrating in a direction of lamination of the laminated structure. The through-hole via is coated with an insulating film in the core portion. The first wiring pattern in the first lamination wiring portion and the second wiring pattern in the second lamination wiring portion can be connected to the other side of the core portion using the through-hole via. Further, the through-hole via according to the present arrangement has a surface coated with an insulating film in the core portion, and therefore insulated from the carbon fiber material included in the core portion.

Preferably, the core insulating layer has a thermal expansion coefficient not smaller than −3 ppm/K but smaller than 8 ppm/K in a surface-spreading direction transverse to the prescribed layer-stacking direction below 150° C. The first insulating layer has a thermal expansion coefficient not smaller than 8 ppm/K but smaller than 20 ppm/K in the surface-spreading direction below 150° C. The second insulating layer has a thermal expansion coefficient not smaller than 20 ppm/K but smaller than 100 ppm/K in the surface-spreading direction below 150° C. Such an arrangement with respect to the thermal expansion coefficient is advantageous in reducing the overall thermal expansion coefficient of the entire multilayer wiring board while reducing delamination in the laminate structure of the core portion, the first lamination wiring portion and the second lamination wiring portion.

Preferably, the carbon fiber material is provided in the form of mesh, cloth or nonwoven fabric. The core insulating layer contains the carbon fiber material at a rate of 30 through 80 vol %. The carbon fiber material is graphitized at a rate not smaller than 99 percent. These arrangements with respect to the carbon fiber material are advantageous in reducing the thermal expansion coefficient of the core portion and therefore of the entire multilayer wiring board.

Preferably, the core insulating layer is formed of a material containing a resin selected from a group consisting of: polysulfone, polyethersulfone, polyphenylsulfone, polyphthalamide, polyamideimide, polyketone, polyacetal, polyimide, polycarbonate, modified-polyphenyleneether, polyphenyleneoxide, polybutyreneterephthalate, polyacrylate, polyphenylenesulfide, polyetheretherketone, tetrafluoroethylene, epoxy, cyanateester, and bismaleimide.

DETAILED DESCRIPTION OF THE PREFERRED EMBODIMENTS

Figure 1:
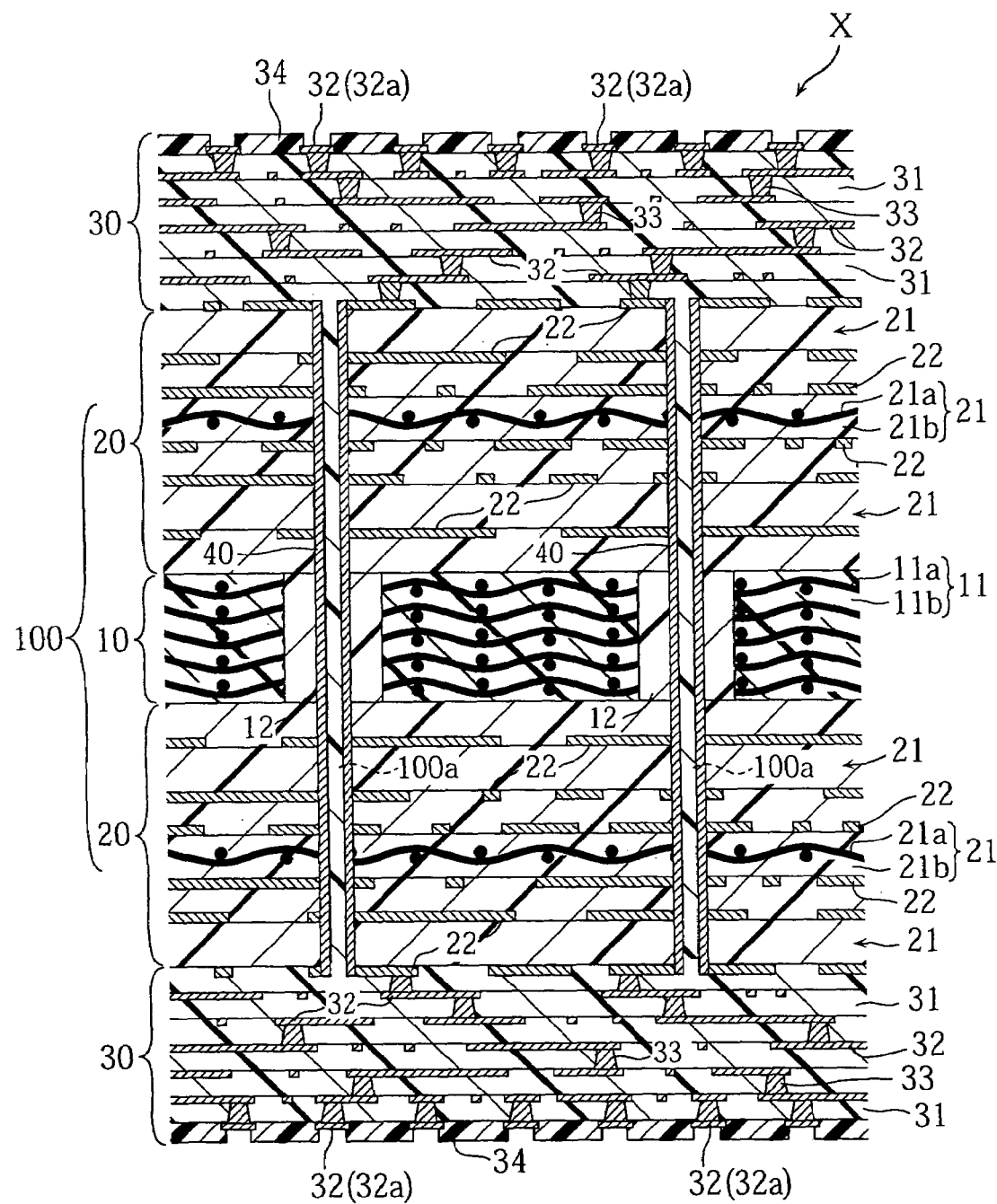
FIG. 1 is a sectional view of a part of a multilayer wiring board according to the present invention.

FIG. 1 is a sectional view of a part of a multilayer wiring board X according to the present invention. The multilayer wiring board X includes: a base substrate 100 having a laminate structure provided by a core portion 10 and multilayer wiring portions 20; and build-up portions 30 laminated respectively on two opposite surfaces of the base substrate 100. The base substrate 100 is formed with through-hole vias 40 extending in the thickness direction of the board X.

The core portion 10 is made of a plate material of carbon fiber reinforced plastic (CFRP), and includes CFRP portions 11 and insulating resin portions 12. The CFRP portion 11 includes carbon fiber material 11a and a resin material 11b which coats the carbon fibers and is hardened.

The carbon fiber material 11a is provided by a carbon fiber cloth, i.e. a cloth woven with carbon fiber threads or bundles of carbon fibers, and is placed to extend in directions along the surface plane of the CFRP portion 11, in other words, in the surface-spreading direction. According to the present embodiment, five sheets of the carbon fiber material 11a are laminated in the direction of thickness, and buried in the resin material 11b. Alternatively to the carbon fiber cloth, the carbon fiber material 11a may be provided by a carbon fiber mesh or a carbon fiber nonwoven fabric. The CFRP portion 11 contains the carbon fiber material 11a at a rate of 30–80 volume percent (vol %). The carbon fiber material 11a is graphitized at a rate of 99% or more. According to the present embodiment, these arrangements achieve a thermal expansion coefficient of not smaller than −3 ppm/K but smaller than 8 ppm/K below 150° C. The "thermal expansion coefficient" here is measured along the plane of surface of the CFRP portion 11, in other words, in the surface-spreading direction, which is transverse (or perpendicular) to the thickness direction of the board X.

The resin material 11b surrounding the carbon fiber material 11a can be provided for example by polysulfone, polyethersulfone, polyphenylsulfone, polyphthalamide, polyamideimide, polyketone, polyacetal, polyimide, polycarbonate, modified-polyphenyleneether, polyphenyleneoxide, polybutyreneterephthalate, polyacrylate, polyphenylenesulfide, polyetheretherketone, tetrafluoroethylene, epoxy, cyanateester, and bismaleimide.

The insulating resin portion 12 provides electric insulation between the carbon fiber material 11a of the CFRP portion 11 and the through-hole vias 40. The insulating resin portion 12 can be provided by a material selected from those listed above in relation with the resin material 11b.

The multilayer wiring portion 20 is formed by so-called single step pressing method into a number of wiring layers, and has a laminate structure including insulating layers 21 and wiring patterns 22. Each insulating layer 21 is provided by a prepreg which is made of a glass cloth 21a impregnated with a resin material 21b. This resin material is hardened. For the sake of simplicity in FIG. 1, the glass cloth 21a is shown only in the fourth insulation layer 21 counted from the side of the core portion 10, and is not illustrated in any other insulation layers 21. The resin material 21b for forming the insulating layer 21 can be provided by a material selected from those listed above in relation with the resin material 11b. According to the present embodiment, the insulating layer 21 has a thermal expansion coefficient of not smaller than 8 ppm/K but smaller than 20 ppm/K along the plane of surface below 150° C. The wiring patterns 22 are made of copper for example, and can take different patterns. Each of the wiring patterns 22 in the layers is electrically connected to each other by the through-hole vias 40.

The build-up portion 30 is a multilayer laminate of wirings formed by so-called build-up method, and the laminated structure includes insulating layers 31 and wiring patterns 32. The insulating layer 31 can be provided for example by a material selected from those listed above in relation with the resin material 11b. According to the present embodiment, the insulating layer 31 has a thermal expansion coefficient of not smaller than 20 ppm/K but smaller than 100 ppm/K along the plane of surface of the insulating layer 31 below 150° C. The wiring pattern 32 is provided by copper for example, and can take different patterns. The wiring patterns 32 formed in mutually adjacent layers are electrically connected to each other by vias 33. The outermost wiring patterns 32 are formed with electrode pads 32a for external connection. The build-up portion 30 has an outermost surface formed with an overcoat layer 34 which has openings correspondingly to the electrode pads 32a.

The through-hole vias 40 provide electrical connection between the wiring structures on the two sides of the base substrate 100, i.e. providing electrical connection between the wiring patterns 22 in the multilayer wiring patterns 20 and the wiring patterns 32 of the build-up portions 30. The through-hole vias 40 are provided by copper plating for example, formed on the walls of through holes 100a which penetrates the base substrate 100. According to the present invention, the copper plating may be substituted by an electrically conductive paste which contains powder of silver or copper: In this case, the through-hole vias are formed by filling the through holes 100a with the paste.

FIGS. 2 through 9 show a method of manufacturing the multilayer wiring board X. In the manufacture of the multilayer wiring board X, first, a CFRP plate 11' as shown in FIG. 2A is prepared. The CFRP plate 11' includes five sheets of a carbon fiber material 11a and a resin material 11b which provides a hard coating around the carbon fibers. The CFRP plate 11' can be prepared as follows for example: First, a sheet of carbon fiber material 11a is impregnated with the resin material 11b in a liquid form. When the resin material 11b is dried but not hardened, a carbon fiber reinforced prepreg is obtained. Next, five sheets of the prepreg made as the above are laminated and pressed in the direction of the lamination under heat, to integrate the five sheets of prepreg, thereby obtain the CFRP plate. Note that for simplification of the figures, the carbon fiber material 11a will not be shown in the step diagrams hereinafter.

Figure 2A:
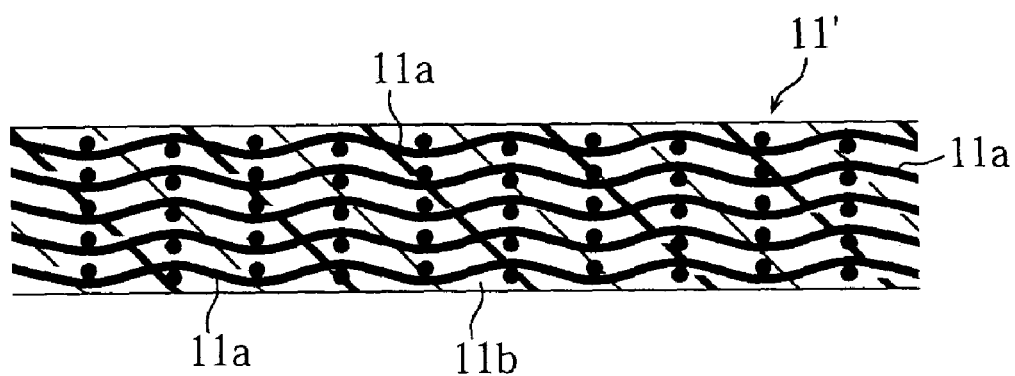
FIGS. 2A and 2B show a step of manufacturing the multilayer wiring board in FIG. 1.
Figure 2B:
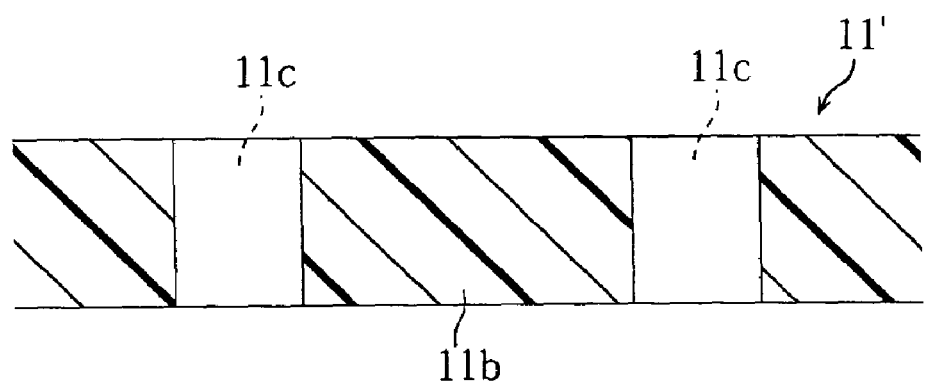

Next, as shown in FIG. 2B, the CFRP plate is formed with through holes 11c at predetermined locations. The through holes 11c have a larger diameter than that of the through-hole vias 40. Specifically, the diameter of the through holes 11c is greater than the diameter of the through-hole vias 40 by 0.2–2.0 mm. The through holes 11c may be formed by means of drilling, die punching or laser abrasion machining.

Figure 3:
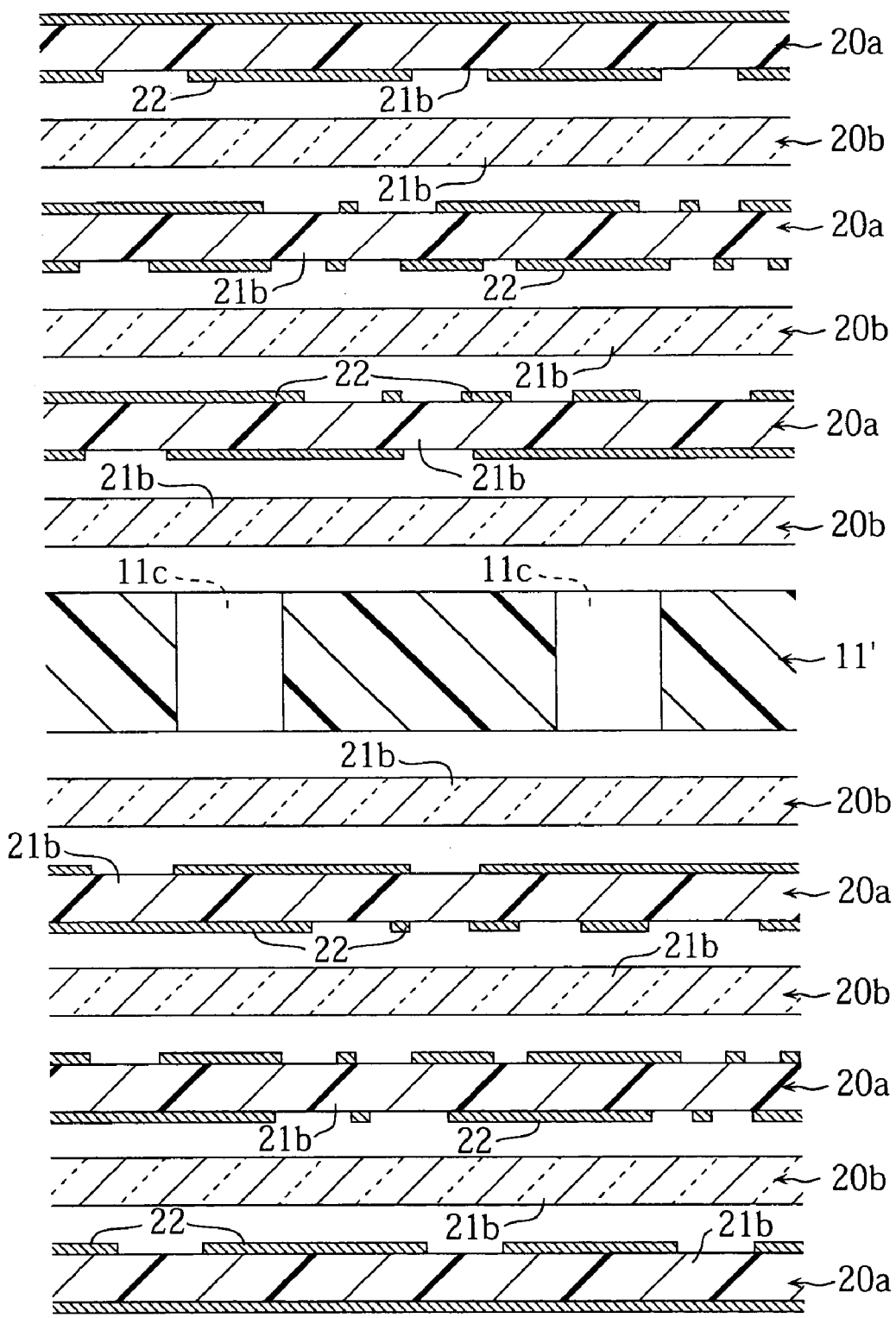
FIG. 3 shows a step following the step in FIG. 2.

Next, the CFRP plate 11' thus prepared, lamination plates 20a for forming a multilayer wiring portion 20, and prepregs 20b are laid up in the order shown in FIG. 3.

Each of the lamination plates 20a is made from a plate having two copper surfaces, and includes a glass cloth 21a, a resin material 21b which provides a hard coating around the glass cloth, and a predetermined wiring pattern 22. For simplicity of the figures, none of the glass cloths 21a is shown in FIG. 3 through FIG. 9. According to the present embodiment, the uppermost and the lowermost lamination plates 20a have their respective one of the copper foils not processed yet. The lamination plates 20a can be made as follows for example: First, a glass cloth 21a is impregnated with the resin material 21b in a liquid form. When the resin material 21b is dried but not hardened, a glass cloth reinforced prepreg is obtained. Next, foils of copper are press-fit to two surfaces of the prepreg made as the above, while the prepreg is heated to set under high temperature and high pressure conditions. Next, a resist pattern is formed on each selected foil of copper for forming a wiring pattern. The copper foil masked by the resist pattern is etched to be a wiring pattern 22. Then, the resist pattern is removed. In this way, the lamination plates 20a each formed with a predetermined wiring pattern 22 are prepared.

The prepreg 20b includes a glass cloth 21a and a resin material 21b which coats the glass cloth but is not hardened yet. The prepreg 20b can be made for example by first impregnating a glass cloth 21a with a resin material 21b in the liquid form, and then drying but not hardening the insulating layer 21.

Figure 4:
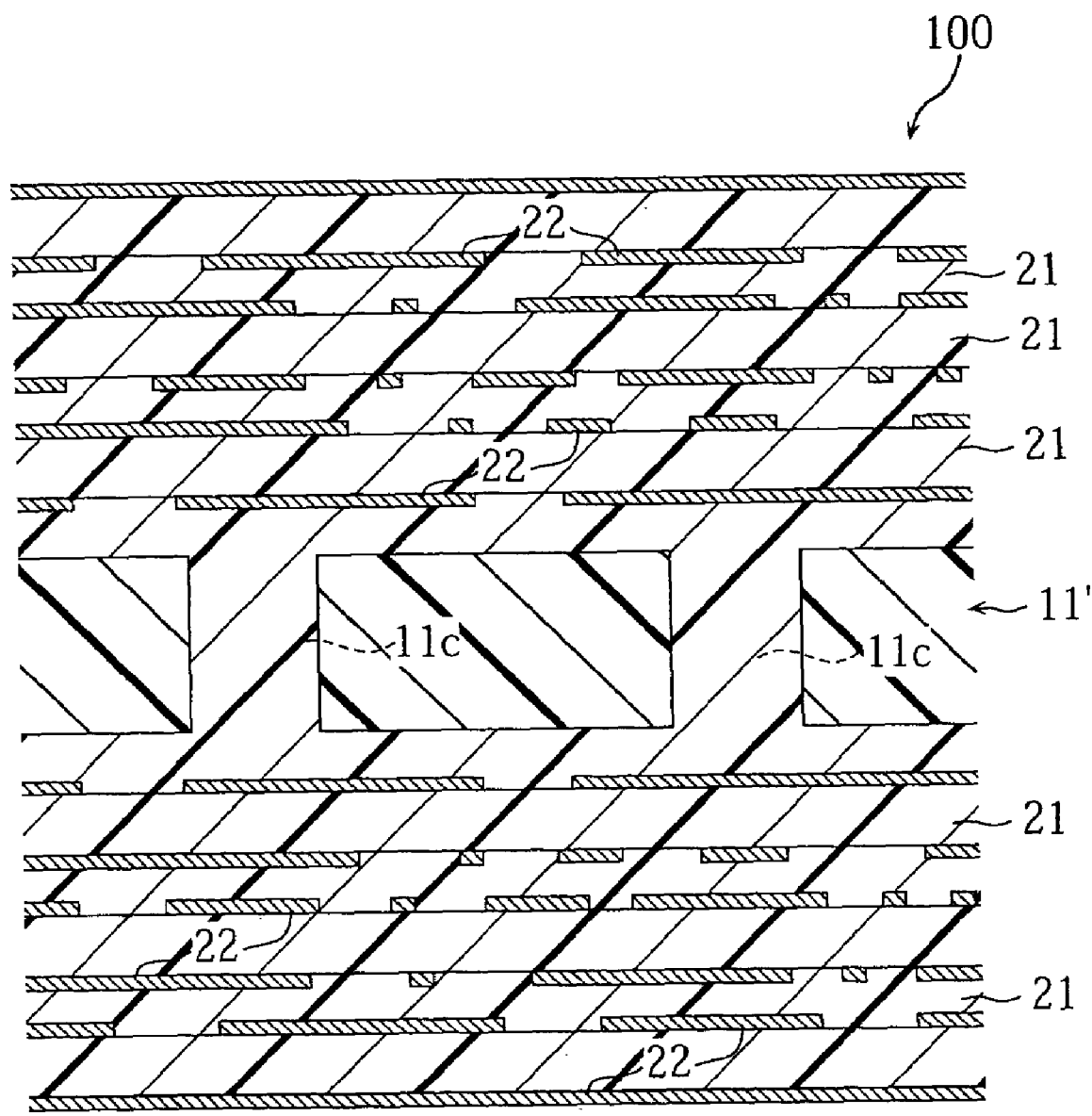
FIG. 4 shows a step following the step in FIG. 3.

For manufacture of the multilayer wiring board X, next, the laminate structure, obtained by the component lay-up in the order shown in FIG. 3, is pressed in the direction of thickness under heat. This hardens the resin material 21b in the prepregs 20b, integrating the CFRP plate 11' with the lamination plates 20a, into a multilayer wiring structure having wiring patterns 22 buried between the insulating layers 21 as shown in FIG. 4. During the pressing, the through holes 11c of the CFRP plate 11' are filled with 21b supplied from the prepregs 20b. Alternatively, the through holes 11c may be filled with resin material which is different from the resin material 21b supplied from the prepregs 20b. In this way, a base substrate 100 is completed.

Figure 5:
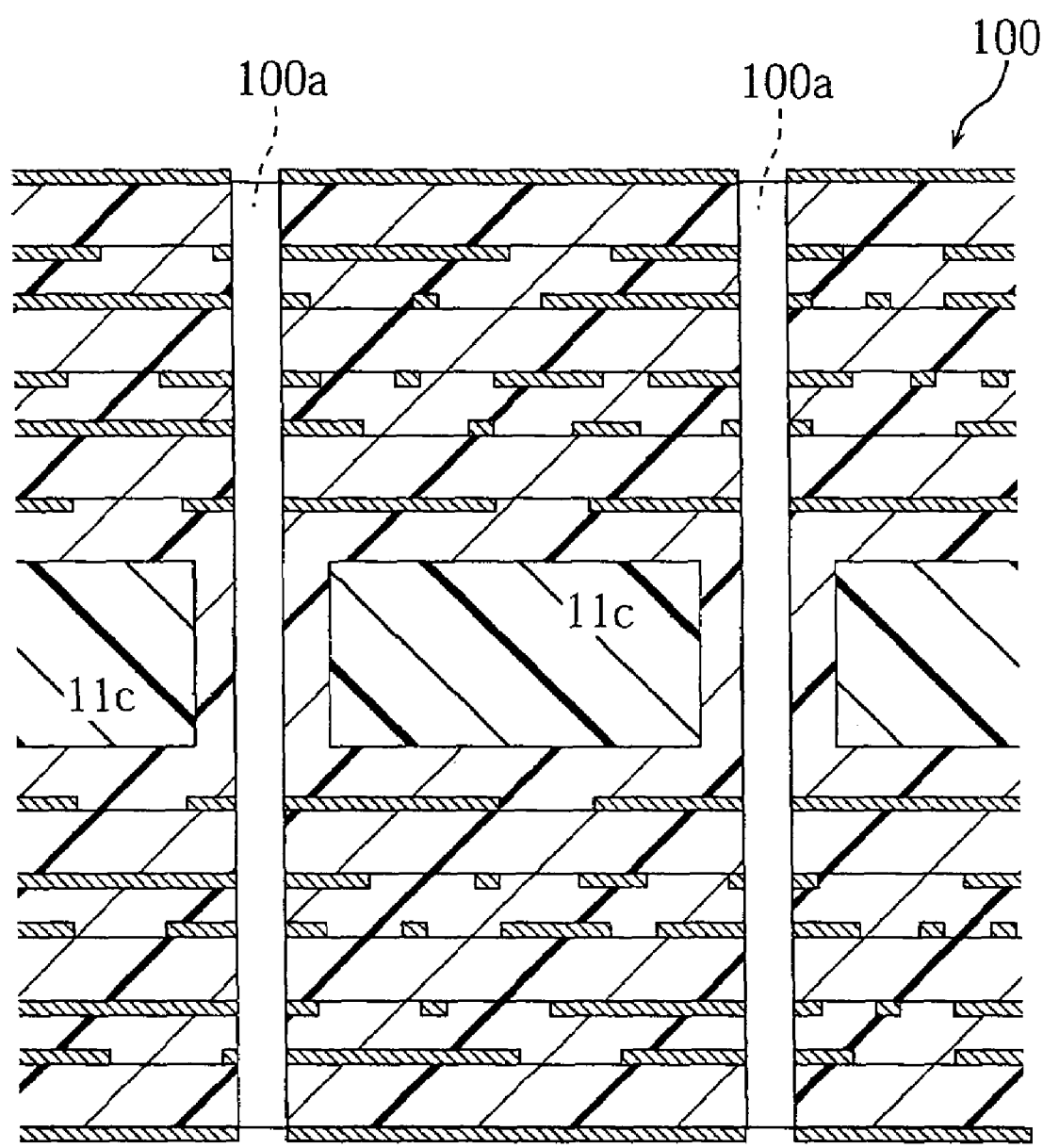
FIG. 5 shows a step following the step in FIG. 4.

Next, as shown in FIG. 5, the base substrate 100 is formed with through holes 100a. The through holes 100a are formed coaxially with the through holes 11c. The through holes 100a can be formed by the same method as used in the formation of the through holes 11c.

Figure 6:
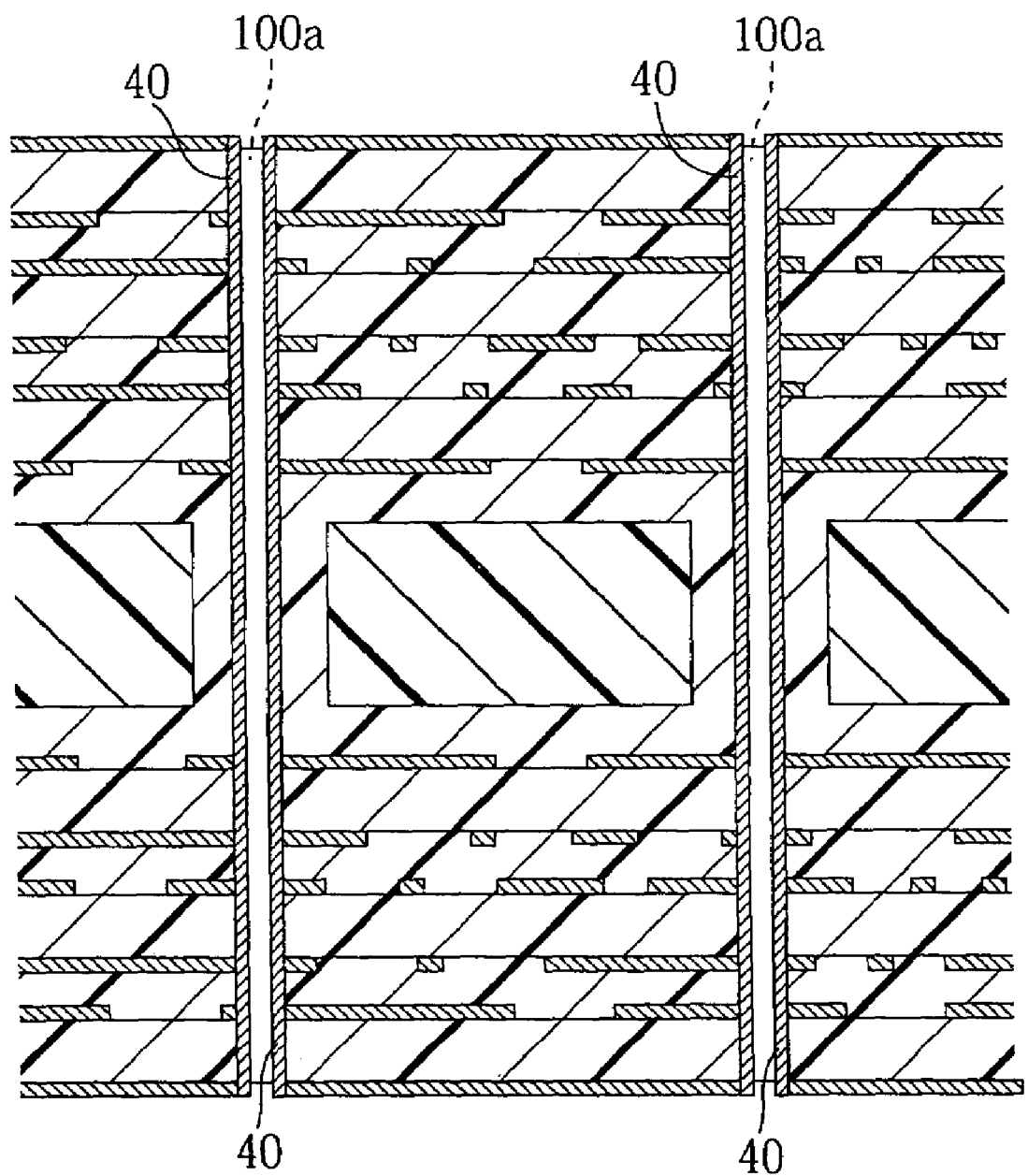
FIG. 6 shows a step following the step in FIG. 5.

Next, as shown in FIG. 6, the through-hole vias 40 are formed in the through holes 100a. Specifically, first, desmearing on the through hole inner walls is performed as required. Then, electroless plating is performed to create a film of electroless copper. Next, electroplating is performed using the electroless copper film as the seed layer, to grow a film of electrically plated copper on the film of electroless copper. According to the present invention, formation of the through-hole vias 40 by means of copper plating may be substituted by formation of the through-hole vias by filling the through holes 100a with electrically conductive paste containing powder of silver or copper. Still alternatively, composite through-hole vias may be formed by first forming the through-hole vias 40 in the through holes 100a and then filling with the electrically conductive paste further.

Figure 7:
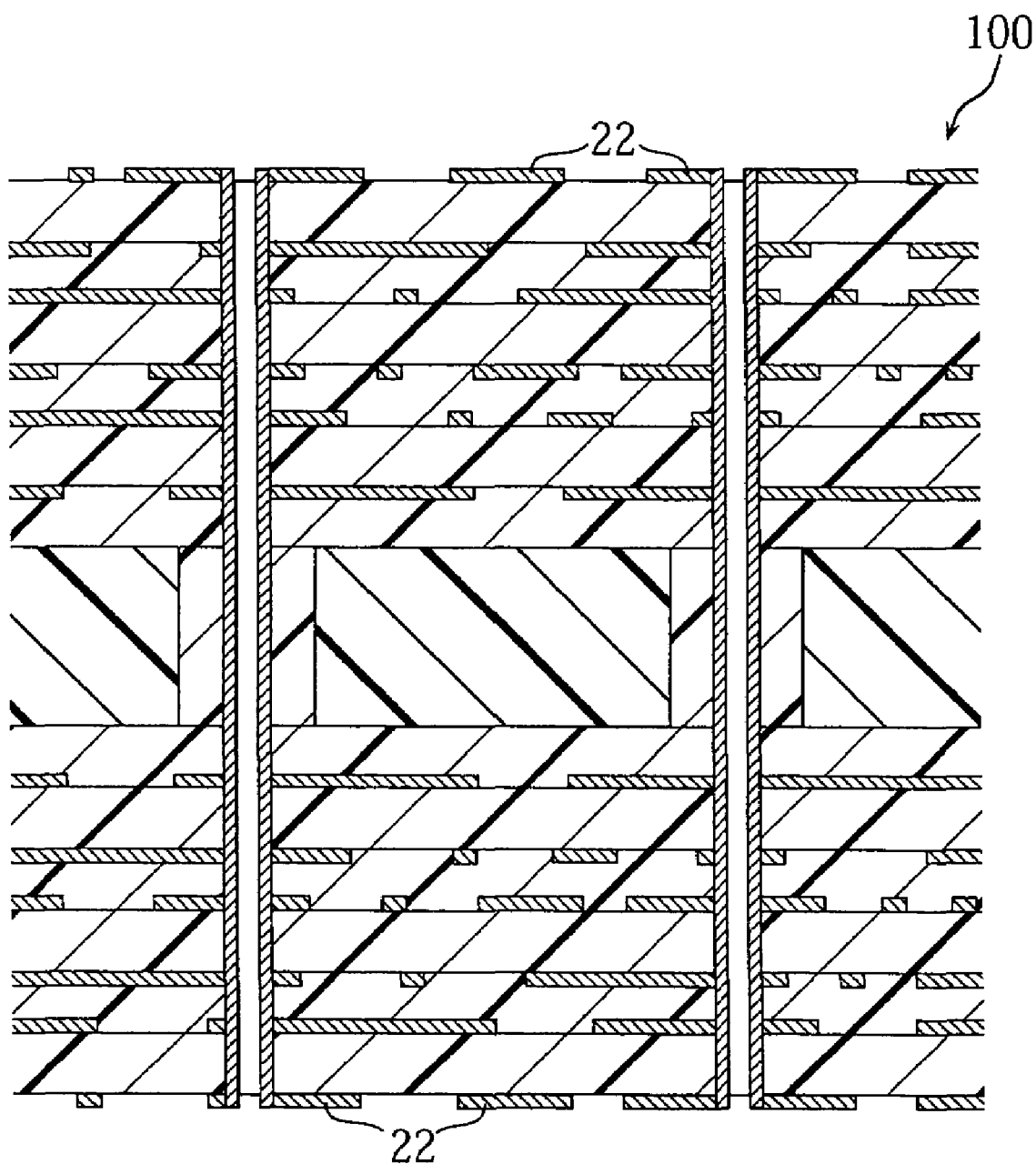
FIG. 7 shows a step following the step in FIG. 6.

Next, as shown in FIG. 7, the unprocessed copper foils on top surfaces of the base substrate 100 are processed by subtractive method, to form predetermined wiring patterns 22 respectively. Specifically, a resist pattern is formed on each of the copper foils in a pattern corresponding to a predetermined wiring pattern 22. After the formation, the copper foil masked by the resist pattern is etched to be the wiring pattern 22.

Figure 8:
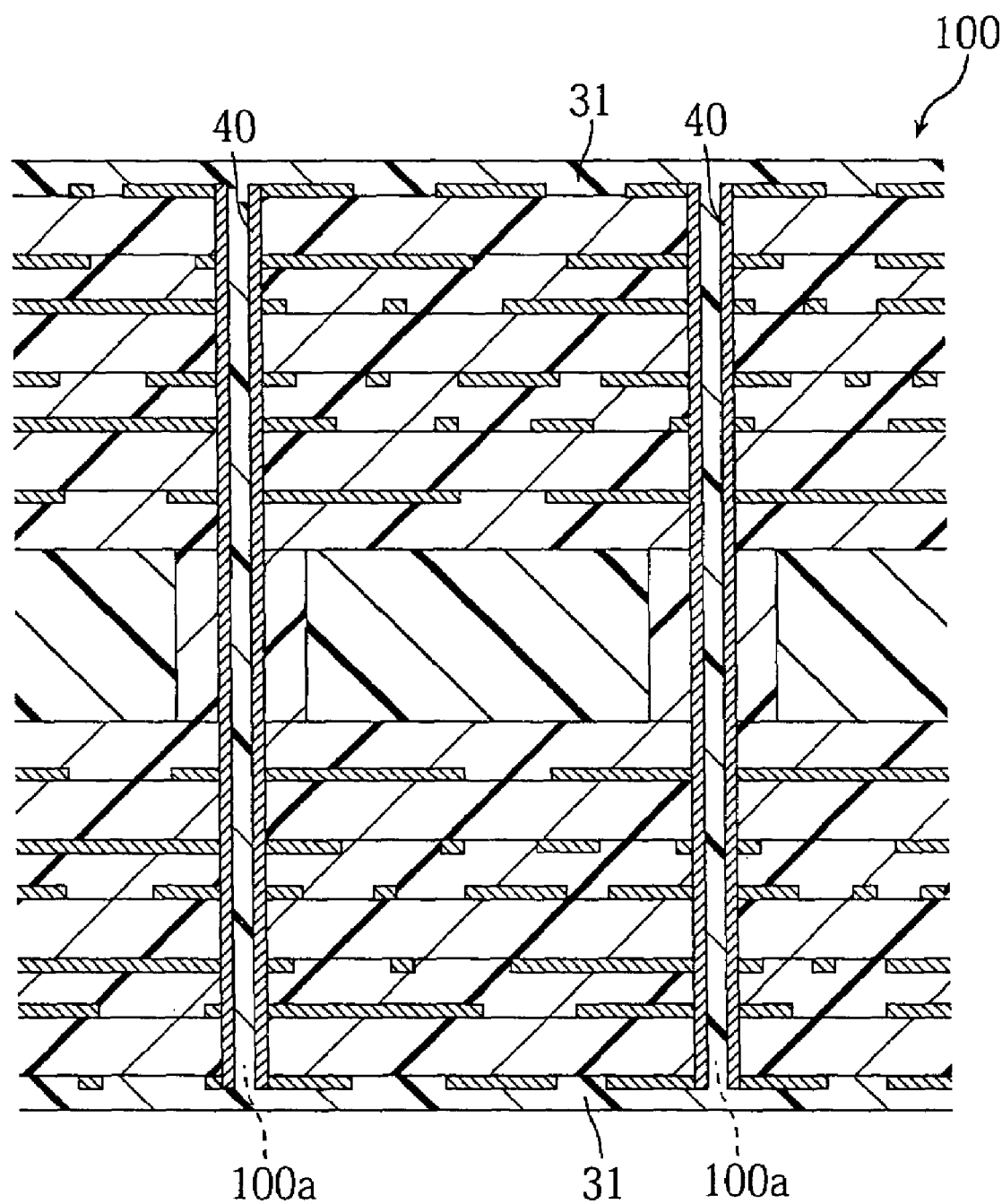
FIG. 8 shows a step following the step in FIG. 7.

Next, as shown in FIG. 8, outermost insulation layers 31 of the build-up portions 30 are formed respectively on the two surfaces of the base substrate 100. Specifically, a film of a predetermined resin material is formed on each side of the base subtract. During this step, the through holes 100a in which the through-hole vias 40 are formed is partially vacuumed for example, to introduce the resin into the through holes 100a thereby filling the through holes 100a with the resin material. If formation of the through-hole vias in the through holes 100a was made by filling electrically conductive paste in the step described with reference to FIG. 7, the filling of the through holes 100a with the resin material is not performed at the present step. The filling of the through holes 100a may be performed before the formation of the build-up portions 30, by using another resin material which is different from the resin material used for the formation of the outermost insulating layers 31 on the build-up portions 30.

Figure 9A:
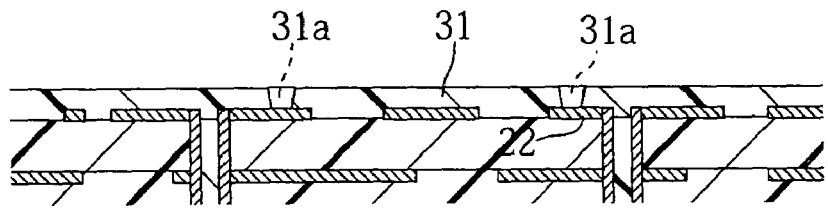
FIGS. 9A~9D show steps following the step in FIG. 8.

Next, as shown in FIG. 9A, via holes 31a are formed in the insulating layer 31. The formation of the via holes can be achieved by means of UV-YAG laser, $CO_2$ laser, excimer laser, dry etching by plasma, and so on. Alternatively, the via holes 31a can be formed by photolithography if the insulating layer 31 is provided by a photosensitive resin. It should be noted that FIG. 9A and the diagrams thereafter show only one of the build-up portions 30.

Figure 9B:
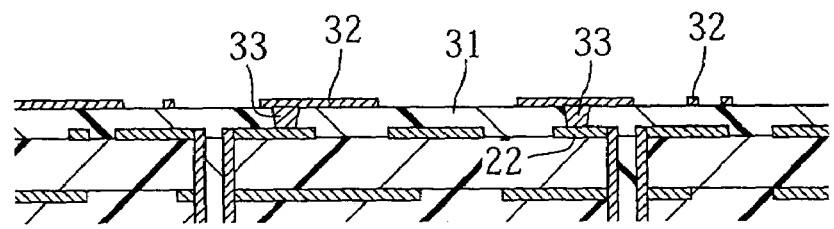

Next, as shown in FIG. 9B, a wiring pattern 32 is formed on the insulating layer 31 and vias 33 are formed in the via holes 31a by semi-additive method. Specifically, first, desmearing is performed as required to roughen surfaces of the insulating layer 31 and the via holes 31a. Then, electroless plating is performed to create a film of electroless copper on the surface of the insulating layer 31 and the via holes 31a. Next, a film of photo-resist is formed, exposed and then developed on the film of electroless copper, to form a resist pattern. The resist pattern includes unmasked regions correspondingly to a desired wiring pattern 32. Next, electroplating is performed using the electroless copper film as the seed layer, to grow a film of electrically plated copper. Next, the resist pattern is removed by etching, and then the electroless copper film masked by the resist pattern is removed by etching. In this way, the wiring pattern 32 and the vias 33 can be formed.

Figure 9C:
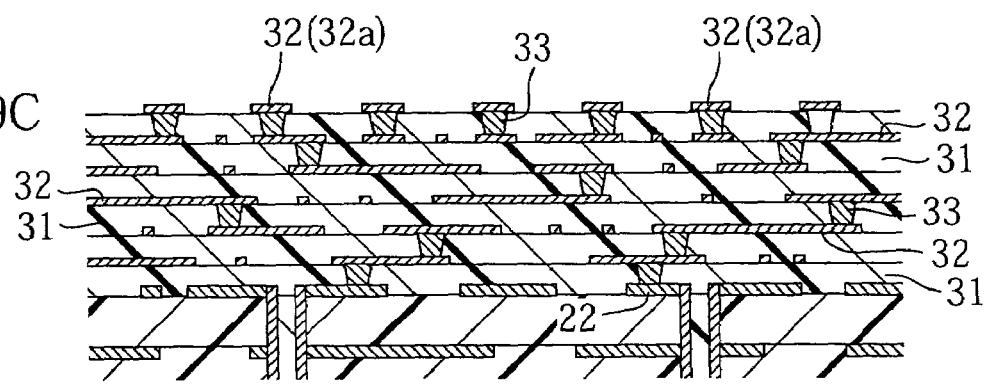

In the manufacture of the multilayer wiring board X, the above build-up cycle of forming an insulating layer 31 and then forming a wiring pattern 32 and vias 33 are repeated for predetermined times, whereby a build-up multilayer wiring structure as shown in FIG. 9C is completed. According to the present embodiment, a total of six layers of the wiring pattern 32 are formed, and the outermost wiring pattern 32 is formed with electrode pads 32a for external connection.

Figure 9D:
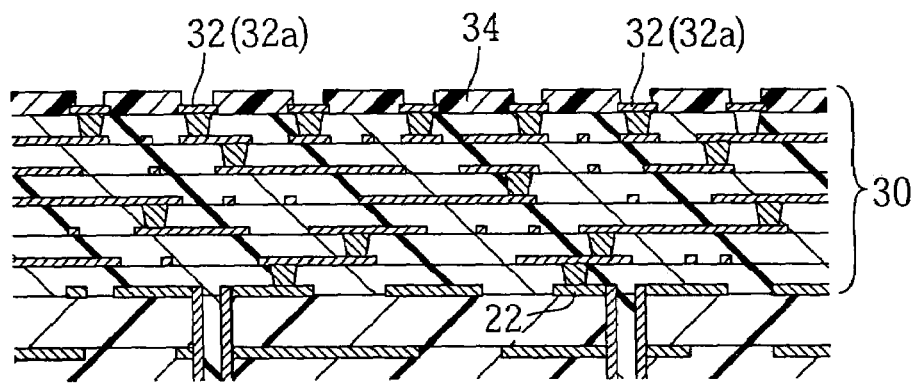

Next, as shown in FIG. 9D, an overcoat layer 34 is formed on the surface of the build-up multilayer wiring structure. The overcoat layer 34 has openings correspondingly to the electrode pads 32a. The overcoat layer 34 can be formed by first printing a film of resin material for the overcoat layer on the build-up portion 30 and then, forming the openings by photolithography. In this way, the build-up portion including a build-up multilayer wiring structure and having a surface covered by an overcoat layer 34 is completed.

The steps described with reference to FIG. 9A through FIG. 9D are performed simultaneously on both sides of the base substrate 100, whereby formation of the build-up portion 30 is achieved on both surfaces of the base substrate 100. In this way, the manufacture is made for the multilayer wiring board X shown in FIG. 1, which includes: abase substrate 100 having a laminate structure provided by a core portion 10 and multilayer wiring portions 20; and build-up portions 30 laminated on each side of the base substrate 100.

The multilayer wiring board X has build-up portions 30 which include very fine and highly dense wiring structures. Further, outermost wiring patterns 32 of the build-up portions 30 can be formed with finely pitched electrode pads 32a for external connection. Therefore, it is possible to mount or install semiconductor chips having finely pitched electrodes for external connection onto the multilayer wiring board X.

The core portion 10 of the multilayer wiring board X includes a carbon fiber material 11a having a very small thermal expansion coefficient. An overall net thermal expansion coefficient of the multilayer wiring board X having such a core portion 10 is −1 through 5 ppm/K according to the present embodiment. A multilayer wiring board X having such a small thermal expansion coefficient not dissimilar from the thermal expansion coefficient of semiconductor chips can reduce undesirable decrease in connection reliability resulting from dissimilarity in the thermal expansion coefficient when semiconductor chips are mounted.

According to the multilayer wiring board X, good connection is achieved between the core portion 10 and the multilayer wiring portion 20, as well as between the multilayer wiring portion 20 and the build-up portion 30. The multilayer wiring board X includes the core portion 10 which has a thermal expansion coefficient small enough to sufficiently reduce the overall thermal expansion coefficient of the substrate, and the build-up portions 30 which are formed with very fine wirings by build-up method and have a relatively large thermal expansion coefficient. If the core portion 10 and the build-up portion 30 are bonded directly, a relatively large difference in the thermal expansion coefficient between the two components will easily cause delamination between the two components. However, according to the multilayer wiring board X, the multilayer wiring portion 20 having a thermal expansion coefficient between those of the core portion 10 and the build-up portion 30 is placed between the core portion 10 and the build-up portion 30. For this reason, bonding between the core portion 10 and the multilayer wiring portion 20 as well as between the multilayer wiring portion 20 and the build-up portion 30 is maintained sufficiently, protecting the multilayer wiring board X from undesirably severe overall structural deterioration.

Next, examples of the present invention will be described, with a comparative sample.

EXAMPLE 1

<Making the Multilayer Wiring Board>

In this example, the CFRP material was provided by a composite material made from carbon fiber cloth and polyimide resin. The CFRP plate was made as follows: First, a carbon fiber cloth (Brand name: TORAYCA manufactured by Toray Industries Inc.) was impregnated with a modified-polyimide thermosetting resin vanish (a vanish containing monomers and so on which are to be polymerized into polyimide), and then dried to obtain a prepreg having a thickness of 0.2 mm. The carbon fiber cloth was a flat-woven cloth. The cloth was woven of carbon fiber threads made by bundling an average of not less than 200 carbon fibers each having a diameter not greater than 10 $\mu$m. In this way, a total of six prepregs were made, then laminated and pressed under vacuum at 200° C. for an hour in the direction of the lamination, to obtain a material CFRP plate having a thickness of 1.2 mm. The CFRP plate had an average thermal expansion coefficient of 0.5 ppm/K along the plane of surface below 150° C.

Next, the CFRP plate was formed with through holes of a 0.5-mm diameter by drilling at predetermined locations. Then, on both surfaces of the CFRP plate, lay-up was made by placing a 0.1-mm thickness prepreg and a 0.1-mm thickness lamination plate having a surface formed with a predetermined wiring pattern, in this order starting from the CFRP plate so that the wiring pattern contacts the prepreg. The prepreg was provided by an FR-4 prepreg (Brand name: R-1661 manufactured by Matsushita Electric Works Ltd.) The lamination plate was made from an FR-4 composite material of glass cloth and epoxy resin (Brand name: R-1766 manufactured by Matsushita Electric Works Ltd.) Specifically, one of the surfaces covered with a foil of copper was formed with a wiring pattern by subtractive method, while the foil of copper on the other surface was left unprocessed. Next, the CFRP plate which has been laid up as described above, two prepregs and two lamination plates were pressed together in a single step pressing method using a vacuum press. Pressing conditions included a peak temperature of 180° C., a pressing time of an hour, and a pressure of 40 kgf/cm$^2$. During this step, the through holes in the CFRP plate were filled with material which was supplied from the prepreg placed on each side of the CFRP plate. In this way, a base substrate having a thickness of 1.6 mm was obtained. The base substrate had an average thermal expansion coefficient of 3 ppm/K along the plane of surface below 150° C. On the other hand, layers of the base substrate other than the CFRP plate, i.e. the layers provided by the FR-4 material, had an average thermal expansion coefficient of 15 ppm/K along the plane of surface below 150° C.

Next, the base substrate was drilled to form through holes of a 0.2-mm diameter running generally coaxially with the through holes made in the CFRP plate. Next, after desmearing, electroless plating and electroplating were performed to the through hole wall surfaces, to form a plated layer of copper. In this way, through-hole vias made of plated copper and penetrating the base substrate were formed.

Next, wiring patterns were formed on the unprocessed foils of copper on both surfaces of the base substrate. Specifically, first, a dry film resist (Brand name: NIT-240 manufactured by Nichigo Morton Co., Ltd.) was pasted onto each cupper foil. After exposure and development, a resist pattern having a predetermined pattern corresponding to the desired wiring pattern was obtained. Next, with this resist pattern serving as a mask, the copper foil was etched in water solution of cupric chloride. Then, 3 weight-percent (wt %) water solution of sodium hydroxide was used to remove the resist pattern. In this way, wiring patterns were formed on both surfaces of the base substrate.

Next, a build-up portion was formed on each side of the base substrate. In the formation of the build-up portion, first a build-up insulating layer was formed on each side of the base substrate. Specifically, a thermoplastic polyimide resin sheet (Brand Name: Espanex, manufactured by Nippon Steel Chemical Co., Ltd.) was laminated on each side. During the step, the through holes were filled with part of the polyimide resin. This polyimide layer had an average thermal expansion coefficient of 60 ppm/K below 150° C. The filling of through holes may alternatively be made before laminating the thermoplastic polyimide resin sheet. Next, each build-up insulating layer was formed with via holes at predetermined locations using UV-YAG laser. Then, a copper wiring pattern was formed on each insulating layer by semi-additive method. During the step, copper was allowed to build-up also on via hole surfaces, so that vias were also formed simultaneously with the copper wiring patterns. Specifically, first, desmearing was performed as required and then, electroless plating was performed to create a film of electroless copper. Next, a film of photo-resist was formed, exposed and then developed on the electroless copper, to form a resist pattern. The resist pattern included unmasked regions correspondingly to the desired wiring pattern. Next, electroplating was performed using the electroless copper film as the seed layer, to grow a film of electrically plated copper. Next, the resist pattern was removed by etching, and then the electroless copper film masked by the resist pattern was removed by etching. Using the above-described semi-additive method, the wiring patterns and the vias were formed. Thereafter, the cycle starting from the formation of build-up insulating layers to the formation of wiring patterns and vias was repeated four times, to form a build-up portion which included five wiring layers on each side of the base substrate.

Next, using screen printing and photolithography, an overcoat layer was formed on each surface of the build-up portion. Each overcoat layer was formed with openings at predetermined locations so that part of the outermost wiring pattern in the build-up portion would be exposed to serve as electrode pads.

The multilayer wiring board made as described had an average thermal expansion coefficient 6 ppm/K along the plane of surface below 150° C. The multilayer wiring board according to the present embodiment was also measured for the amount of warpage, which was found to be not greater than 10 $\mu$m in a 20-mm span of chip mounting area on a surface of the multilayer wiring board.

<Temperature Cycle Test>

The multilayer wiring board according to the present embodiment was mounted with a predetermined semiconductor chip having a plurality of bump electrodes for external connection, and was subjected to a temperature cycle test to study connection reliability between the semiconductor chip and the multilayer wiring board. Specifically, first, each electrical connection between the semiconductor chip and the multilayer wiring board was subjected to initial conductivity resistance measurement. Next, the temperature cycle test was performed within a temperature range from −65° C. through 125° C. Thereafter, conductivity resistance measurement was made again for each of the electrical connections. The temperature cycle test used a cycle of cooling at −65° C. for 15 minutes, which was followed by heating at 125° C. for 15 minutes, and this cycle was repeated 1000 times. As a result, rate of change in resistance at each electrical connection was found to be smaller than 10 percent, confirming that good connections were formed. No cracks or delaminations were found between bump electrodes on the semiconductor chip and the electrode pads on the multilayer wiring board.

EXAMPLE 2

<Making the Multilayer Wiring Board>

In this example, the CFRP material was provided by a composite material made from carbon fiber cloth and epoxy resin. The CFRP plate was made as follows: First, a carbon fiber cloth (Brand name: TORAYCA manufactured by Toray Industries Inc.) was impregnated with an epoxy resin vanish (a vanish containing monomers and so on which are to be polymerized into epoxy resin), and then dried to obtain a prepreg having a thickness of 0.2 mm. The carbon fiber cloth was a flat-woven cloth. The cloth was woven of carbon fiber threads made by bundling an average of not less than 200 carbon fibers each having a diameter not greater than 10 $\mu$m. In this way, ten prepregs were made, then laminated and pressed under vacuum at 170° C. for an hour in the direction of the lamination, to obtain a material CFRP plate having a thickness of about 2 mm. The CFRP plate had an average thermal expansion coefficient of 0.3 ppm/K along the plane of surface below 150° C.

Next, the CFRP plate was formed with through holes of a 0.6-mm diameter by drilling at predetermined locations. Then, on both surfaces of the CFRP plate, lay-up was made by placing a 0.1-mm thickness prepreg and a 0.1-mm thickness first lamination plate having both surfaces formed with predetermined wiring patterns respectively, a 0.1-mm thickness prepreg and a 0.1-mm thickness second lamination plate having a surface formed with a predetermined wiring pattern, so that the wiring patterns make contact with respective prepregs. The prepreg was provided by an FR-4 prepreg (Brand name: R-1661 manufactured by Matsushita Electric Works Ltd) which was a composite of glass cloth and epoxy resin. The first lamination plate was made from an FR-4 composite material of glass cloth and epoxy resin (Brand name: R-1766 manufactured by Matsushita Electric Works Ltd.): Specifically, each of the surfaces covered with a foil of copper was formed with a wiring pattern by subtractive method. The second lamination plate was made from an FR-4 composite material of glass cloth and epoxy resin (Brand name: R-1766 manufactured by Matsushita Electric Works Ltd.): Specifically, one of the surfaces covered with a foil of copper was formed with a wiring pattern by subtractive method, while the foil of copper on the other surface was left unprocessed. Next, the CFRP plate which has been laid up as described above, four prepregs and four lamination plates were pressed together in a single step pressing method using a vacuum press. Pressing conditions included a peak temperature of 180° C., a pressing time of an hour, and a pressure of 40 kgf/cm². During this step, the through holes in the CFRP plate were filled with material which was supplied from the prepregs placed on each side of the CFRP plate. The filling of through holes may alternatively be made before the single-step lamination by using a different resin material. In this way, a base substrate having a thickness of 2.8 mm was obtained. The base substrate had an average thermal expansion coefficient of 2.5 ppm/K along the plane of surface below 150° C. On the other hand, layers of the base substrate other than the CFRP plate, i.e. the layers provided by the FR-4 material, had an average thermal expansion coefficient of 15 ppm/K along the plane of surface below 150° C., as was described earlier in relation with Example 1.

Next, the base substrate was drilled to form through holes of a 0.6-mm diameter running generally coaxially with the through holes made in the CFRP plate. Next, after desmearing, electroless plating and electroplating were performed to the through hole wall surfaces, to form a plated layer of copper. The through holes plated with copper were then filled with copper paste. Since the copper paste will shrink when heated, the filling was made until the paste overflowed from the though holes. The copper paste included copper powder and epoxy resin (non-solvent type). The base substrate was then heated for an hour at 170° C., and thereafter excess paste bulging out of the thorough holes was removed by buffing.

Next, wiring patterns were formed on the unprocessed foils of copper on both surfaces of the base substrate. Specifically, the same steps as performed in Example 1 for forming the wiring patterns on the surface of the base substrate were followed.

Next, a build-up portion was formed on each side of the base substrate. In the formation of the build-up portion, first a build-up insulating layer was formed on each side of the base substrate. Specifically, an epoxy resin sheet (Brand Name: SH-9, manufactured by Ajinomoto Co., Inc.) was laminated on each side. During the step, the through holes were filled with part of the epoxy resin. This epoxy layer had an average thermal expansion coefficient of 70 ppm/K below 150° C. The filling of through holes may alternatively be made before laminating the epoxy resin sheet. Next, each build-up insulating layers was formed with via holes at predetermined locations using UV-YAG laser. Then, a copper wiring pattern was formed on each insulating layer by semi-additive method in the same way as Example 1. During the step, copper was allowed to build also on via hole surfaces and therefore, vias were also formed simultaneously with the copper wiring patterns. Thereafter, the cycle starting from the formation of build-up insulating layers to the formation of wiring patterns and vias was repeated four times, to form a build-up portion which included five wiring layers on each side of the base substrate.

Next, using screen printing and photolithography, an overcoat layer was formed on each surface of the build-up portion. Each overcoat layer was formed with openings at predetermined locations so that part of the outermost wiring pattern in the build-up portion would be exposed to serve as electrode pads.

The multilayer wiring board made as described had an average thermal expansion coefficient 4 ppm/K along the plane of surface below 150° C. The multilayer wiring board according to the present example was also measured for the amount of warpage, which was found to be not greater than 10 $\mu$m in a 20-mm span of chip mounting area on a surface of the multilayer wiring board.

<Temperature Cycle Test>

The obtained multilayer wiring board was mounted with a predetermined semiconductor chip having a plurality of bump electrodes for external connection, and was subjected to the same temperature cycle test as in Example 1 to study connection reliability between the semiconductor chip and the multilayer wiring board. As a result, rate of change in resistance at each electrical connection was found to be smaller than 10%, confirming that good connections were formed. No cracks or delaminations were found between bump electrodes on the semiconductor chip and the electrode pads on the multilayer wiring board.

Comparative Sample 1

The base substrate according to Example 1 was replaced by an organic core substrate of the same size. To this organic core substrate, the same steps as in Example 1 were followed to form build-up portions, and thereby obtain a multilayer wiring board serving as the comparative sample. The organic core substrate was provided by a BT resin substrate. The organic-core multilayer wiring board according to the comparative sample was measured for the amount of warpage, which was found to be about 30 μm in a 20-mm span of chip mounting area. The organic-core multilayer wiring board was mounted with a predetermined semiconductor chip having a plurality of bump electrodes for external connection, and was subjected to the same temperature cycle test as in Example 1 to study connection reliability between the semiconductor chip and the multilayer wiring board. As a result, rate of change in resistance at each electrical connection exceeded 10% at the 300th cycle. Further, cracks were found on some of the connections between bump electrodes on the semiconductor chip and the electrode pads on the multilayer wiring board, at the 300th cycle.

Evaluation

The multilayer wiring boards according to Example 1 and Example 2 were each made from a CFRP material given a small thermal expansion coefficient by glass fiber and a FR-4 material containing glass cloth. Both multilayer wiring boards had a laminated structure provided by a multilayer wiring structure formed by single step pressing method and another multilayer wiring structure formed by build-up method. The temperature cycle test confirmed that both of the multilayer wiring boards according to Example 1 and Example 2 had higher connection reliability than the conventional organic-core multilayer wiring board according to Comparative Sample 1. The higher connection reliability achieved in the multilayer wiring boards according to Example 1 and Example 2 can be attributed to a smaller thermal expansion coefficient in these multilayer wiring boards than in the organic-core multilayer wiring board.

According to the present invention, a multilayer wiring board can be formed with micro-wiring patterns and can have an appropriately small thermal expansion coefficient. Such a multilayer wiring board is suitable for mounting semiconductor chips having finely pitched external connection electrodes and an essentially small thermal expansion coefficient, and therefore applicable to semiconductor chip mounting boards, motherboards, substrates for probe cards and so on.

What is claimed is:

1. A multilayer wiring board comprising:
    a core portion including a core insulating layer containing a carbon fiber material;
    a first lamination wiring portion bonded to the core portion and having a laminated structure including at least a first insulating layer and a first wiring pattern, the first insulating layer containing glass cloth; and
    a second lamination wiring portion bonded to the first lamination wiring portion and having a laminated structure including at least a second insulating layer and a second wiring pattern;
    wherein the core portion, the first lamination wiring portion and the second lamination wiring portion are arranged in a stack; and
    wherein the core insulating layer, the first insulating layer and the second insulating layer have respective thermal expansion coefficients defined in a surface-spreading direction transverse to a stacking direction of these three layers, the thermal expansion coefficient of the core insulating layer being smallest among said three layers, the thermal expansion coefficient of the second insulating layer being largest among said three layers, the thermal expansion coefficient of the first insulating layer being larger than that of the core layer but smaller than that of the second insulating layer.

2. The multilayer wiring board according to claim 1, further comprising a through-hole via extending through both the core portion and the first lamination wiring portion, wherein the through-hole via is insulated from the core portion by an insulating layer surrounding the through-hole via.

3. The multilayer wiring board according to claim 1, wherein the thermal expansion coefficient of the core insulating layer is no smaller than −3 ppm/K but smaller than 8 ppm/K below 150° C., the thermal expansion coefficient of the first insulating layer being no smaller than 8 ppm/K but smaller than 20 ppm/K below 150° C., the thermal expansion coefficient of the second insulating layer being no smaller than 20 ppm/K but smaller than 100 ppm/K below 150° C.

4. The multilayer wiring board according to claim 1, wherein the carbon fiber material is provided in a form of mesh, cloth or nonwoven fabric.

5. The multilayer wiring board according to claim 1, wherein the core insulating layer contains the carbon fiber material at a rate of 30 through 80 vol %.

6. The multilayer wiring board according to claim 1, wherein the carbon fiber material is graphitized at a rate not smaller than 99%.

7. The multilayer wiring board according to claim 1, wherein
    the core insulating layer is formed of a material containing a resin that is selected from a group consisting of: polysulfone, polyethersulfone, polyphenylsulfone, polyphthalamide, polyamideimide, polyketone, polyacetal, polyimide, polycarbonate, modified-polyphenyleneether, polyphenyleneoxide, polybutyreneterephthalate, polyacrylate, polyphenylenesulfide, polyetheretherketone, tetrafluoroethylene, epoxy, cyanateester, and bismaleimide.

8. A multilayer wiring board comprising:
    a core portion including a core insulating layer containing a carbon fiber material;
    two first lamination wiring portions respectively bonded to opposite sides of the core portion, each of the first lamination wiring portions having a laminated structure including at least a first insulating layer and a first wiring pattern, the first insulating layer containing glass cloth; and
    a second lamination wiring portion bonded to one of the first lamination wiring portions and having a laminated structure including at least a second insulating layer and a second wiring pattern;
    wherein the core portion, the first lamination wiring portions and the second lamination wiring portion are arranged in a stack; and
    wherein the core insulating layer, the first insulating layer and the second insulating layer have respective thermal expansion coefficients defined in a surface-spreading direction transverse to a stacking direction of these three layers, the thermal expansion coefficient of the core insulating layer being smallest among said three layers, the thermal expansion coefficient of the second insulating layer being largest among said three layers, the thermal expansion coefficient of the first insulating layer being larger than that of the core layer but smaller than that of the second insulating layer.

9. The multilayer wiring board according to claim 8, further comprising an additional second lamination wiring portion, wherein the additional second lamination wiring portion has a laminated structure including at least a second insulating layer and a second wiring pattern, and is bonded to the first lamination wiring portion other than said one of the first lamination wiring portions.

* * * * *